(12) United States Patent
Kim et al.

(10) Patent No.: US 8,413,796 B2
(45) Date of Patent: Apr. 9, 2013

(54) SPUTTER TRAY MOVING SYSTEM

(75) Inventors: Yang-Soo Kim, Cheonan-si (KR);
 Young-Min Kee, Cheonan-si (KR);
 Chang-Jin Kim, Yongin-si (KR);
 Byung-Hun Kim, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 404 days.

(21) Appl. No.: 12/487,806

(22) Filed: Jun. 19, 2009

(65) Prior Publication Data

US 2010/0101920 A1    Apr. 29, 2010

(30) Foreign Application Priority Data

Oct. 23, 2008 (KR) .................. 10-2008-0104178

(51) Int. Cl.
 *B65G 13/06* (2006.01)
(52) U.S. Cl. .................... 198/788; 198/465.1
(58) Field of Classification Search .......... 104/168; 198/465.1, 780
 See application file for complete search history.

(56) References Cited

U.S. PATENT DOCUMENTS

| | | | | |
|---|---|---|---|---|
| 3,787,312 A * | 1/1974 | Wagner et al. | ............ | 204/298.11 |
| 4,718,349 A * | 1/1988 | Wahren | ............ | 104/165 |
| 4,934,515 A * | 6/1990 | Linden | ............ | 198/803.2 |
| 4,981,462 A * | 1/1991 | White et al. | ............ | 474/238 |
| 5,097,794 A * | 3/1992 | Mahler et al. | ............ | 118/719 |
| 5,133,285 A * | 7/1992 | Mahler et al. | ............ | 118/719 |
| 5,147,168 A * | 9/1992 | Suwa et al. | ............ | 414/217 |
| 5,244,559 A * | 9/1993 | Latz | ............ | 204/298.09 |
| 5,388,684 A * | 2/1995 | Peck | ............ | 198/465.1 |
| 5,538,610 A * | 7/1996 | Gesche et al. | ............ | 204/298.15 |
| 5,960,938 A * | 10/1999 | Clopton | ............ | 198/867.13 |
| 6,062,378 A * | 5/2000 | Clopton | ............ | 198/867.13 |
| 6,123,028 A * | 9/2000 | Bellezza | ............ | 104/172.3 |
| 6,237,755 B1 * | 5/2001 | Clopton | ............ | 198/867.13 |
| 7,296,673 B2 | 11/2007 | Blonigan et al. | | |
| 7,481,728 B2 * | 1/2009 | Pippin | ............ | 474/148 |

FOREIGN PATENT DOCUMENTS

| | | |
|---|---|---|
| JP | 07-069446 | 3/1995 |
| JP | 2000-318819 A | 11/2000 |
| JP | 2004-127998 A | 4/2004 |
| JP | 2004-207554 A | 7/2004 |
| KR | 1998-0066393 | 10/1998 |
| KR | 10-2003-0091304 A | 12/2003 |
| KR | 10-2004-0060101 A | 7/2004 |
| KR | 10-2006-0078538 A | 7/2006 |
| KR | 10-2007-00111943 A | 11/2007 |

\* cited by examiner

*Primary Examiner* — Gene Crawford
*Assistant Examiner* — William R Harp
(74) *Attorney, Agent, or Firm* — Cantor Colburn LLP

(57) ABSTRACT

A sputter tray moving system includes a sputter tray, a guide disposed under the sputter tray and including a groove, a pulley engaged with the groove of the guide and a buffer member disposed between the sputter tray and the guide. The sputter tray is moved when the pulley engaged with the groove of the guide is rotated in a rotation direction.

14 Claims, 3 Drawing Sheets

SPUTTER TRAY MOVING SYSTEM

This application claims priority to Korean Patent Application No. 10-2008-0104178 filed in the Korean Intellectual Property Office on Oct. 23, 2008, and all the benefits accruing therefrom under 35 U.S.C. §119, the entire contents of which are incorporated herein by reference.

BACKGROUND OF THE INVENTION (a) Field of the Invention

The present invention relates to a sputter tray moving system for a sputtering process.

(b) Description of the Related Art

A liquid crystal display ("LCD") is one of the most commonly used flat panel displays. The LCD may include two substrates with electrodes formed thereon, and a liquid crystal layer interposed between the two substrates. In the LCD, a voltage is applied to the electrodes to realign liquid crystal molecules of the liquid crystal layer, to thereby regulate the transmittance of light passing through the liquid crystal layer.

Two display panels include metal wiring, such as a gate line transmitting a scanning signal and a data line transmitting a data signal, as well as electrodes.

This metal wiring or these electrodes are formed through deposition on the display panel, and sputtering is executed for the deposition.

The sputtering is executed after reducing pressure and heating during processing of the substrate, while moving a sputter tray disposed on the substrate to each processing chamber. A rack & pinion type and a timing belt pulley type are used as the moving system of the sputter tray.

BRIEF SUMMARY OF THE INVENTION

Since a moving system of the sputter tray may include a rack & pinion type and a timing belt pulley type, there may be technical difficulties in using the rack & pinion type and a timing belt pulley type, and in processing the display panel. For example, in the rack & pinion type, the sputter tray is moved by a saw-toothed wheel which generates an impact due to a processing error, vibrating the substrate of the display panel, increasing a contact area when moving the sputter tray to each processing chamber and resulting in particles of the material sputtered to the sputter tray undesirably generating foreign particles on the substrate. Additionally, there is a disadvantage that apparatus error is often generated due the unstable vertical variation of the sputter tray.

In the timing belt pulley type, a timing belt moves the pulley to move the sputter tray, such that a slip occurs upon moving or stopping when moving the sputter tray to each chamber. The slip undesirably vibrates the substrate of the display panel, and as a result, the particles of the material sputtered to the sputter tray generate foreign particles on the substrate. Additionally, there is a disadvantage that the timing belt must be managed during processing of the display panel.

An exemplary embodiment of the present invention maximizes a friction control force of moving or stopping, when moving the sputter tray including a substrate in the sputtering process, to vibrate the substrate.

An exemplary embodiment of a sputter tray moving system includes a sputter tray, a guide disposed under the sputter tray and including a groove, a pulley engaged with the groove of the guide, and a buffer member disposed between the sputter tray and the guide. The sputter tray is moved by rotating the pulley engaged with the groove of the guide. The surfaces of both of opposing sides of the groove of the guide, with respect to the pulley, may be tapered.

The pulley may have substantially a wedge shape in a cross section.

The sputter tray moving system may further include a motor driving the pulley.

The pulley and the motor may be connected through a driving shaft.

The sputter tray moving system may further include a fixing member fixing the guide to the sputter tray.

The groove of the guide may be provided as a plurality thereof.

The pulley may include a plurality of a protrusion.

The protrusions of the pulley may be disposed according to the circumference of the pulley, and are engaged with the grooves of the guide, respectively.

An exemplary embodiment of a sputter tray moving system includes a sputter tray, a roller rotatable in a first direction, a guide including a groove and disposed between the sputter tray and the roller, the groove longitudinally extended in the first direction, and a buffer member disposed between the sputter tray and the guide. An outer surface of the roller is engaged with and contacts an inner surface of the groove of the guide, such that the sputter tray is moved in the first direction when the pulley is rotated in the first direction.

In an exemplary embodiment of the present invention, the vibration of the substrate is reduced or effectively prevented by maximizing the friction control force when the sputter tray disposed on the substrate is moved and stopped, thereby advantageously reducing or effectively preventing the generation of foreign particle on the substrate.

DETAILED DESCRIPTION OF THE INVENTION

Figure 1:
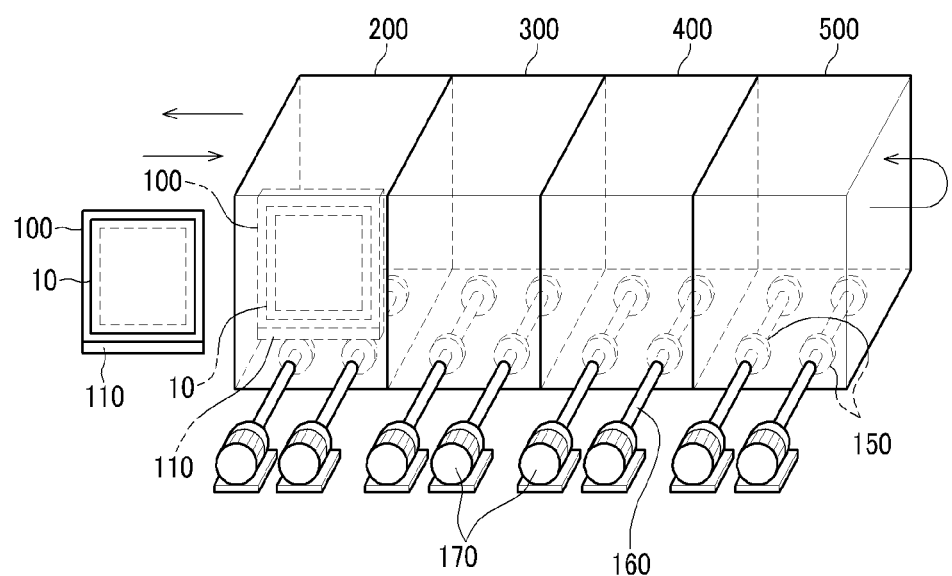
FIG. 1 is a perspective view showing an exemplary embodiment of a sputtering process, according to the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. In the drawings, the thickness of layers, films, panels, regions, etc., are exaggerated for clarity. Like reference numerals designate like elements throughout the specification. As used herein, the term "and/or" includes any and all combinations of one or more of the associated listed items.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower", "under," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings. Exemplary embodiments of a sputter tray moving system according to the present invention will be described with reference FIG. 1 and FIG. 2.

FIG. 1 is a perspective view showing an exemplary embodiment of a sputtering process according to the present invention.

As shown in FIG. 1, the sputtering process equipment sequentially includes a pressure chamber 200, a heating chamber 300, a sputtering chamber 400, and a rotation chamber 500.

A substrate 10 is disposed on a sputter tray 100, and the sputter tray 100 is vertically oriented. As illustrated in FIG. 1, the substrate 10 is vertically oriented such that the substrate 10 includes a lower edge of the substrate 10 disposed toward a system of pulleys and motors, described in detail below, and an upper edge disposed opposing the lower edge relative to the substrate 10. A first face (or surface) of the substrate 10 and the sputter tray 100, such as viewable in the perspective view of FIG. 1, opposes a second face (or surface) of the substrate 10 and the sputter tray 100 (not viewable in the perspective view of FIG. 1).

A guide 110 is attached under (e.g., at a lower edge of) the sputter tray 100 at a same side as the lower edge of the substrate 10. A pulley 150 is respectively disposed in each of the pressure chamber 200, the heating chamber 300, the sputtering chamber 400, and the rotation chamber 500, at a lower portion of the respective chamber. A plurality of the pulley 150 may be disposed in each of the pressure chamber 200, the heating chamber 300, the sputtering chamber 400, and the rotation chamber 500. Alternatively, a single one of the pulley 150 may be disposed in some or all of the pressure chamber 200, the heating chamber 300, the sputtering chamber 400, and the rotation chamber 500. The lower edges of the substrate 10 and the sputter tray 100 are disposed proximate to the lower portion of the pressure chamber 200, the heating chamber 300, the sputtering chamber 400, and the rotation chamber 500 during processing.

Each pulley 150 is respectively connected to a motor 170 through a driving shaft 160. When the motor 170 is operated, the pulley 150 is rotated about an axis of the driving shaft 160. A single one of the motor 170 is connected to a single on of the each pulley 150, such that control of the pulleys 150 is simplified and relatively easy. The pulley 150 may be hereinafter referred to as a "roller" or "rotating element."

The guide 110, which is attached to the lower edge of the sputter tray 100, and the pulleys 150 of the pressure chamber 200, the heating chamber 300, the sputtering chamber 400, and the rotation chamber 500 are configured to engage with each other, respectively, such that when the pulleys 150 engaged with the guide 110 are rotated, the sputter tray 100 moves along a rotation direction of the pulleys 150. The rotation direction of the pulleys 150 is indicated by the left-pointing and right-pointing arrows adjacent to the pressure chamber 200 in FIG. 1. The rotation direction may also be referred to as a movement direction of the sputter tray 100 and/or the guide 110.

In the sequence of sputtering process equipment illustrated in FIG. 1, the substrate 10 disposed on the sputter tray 100 disposed is moved to the pressure chamber 200, in a right direction indicated by the right-pointing arrow, during a first pass of the sputter tray 100 through the sputtering process. In an exemplary embodiment, a pressure of the pressure chamber 200 is reduced, such as to a vacuum state.

The sputter tray 100 is transferred to the heating chamber 300 directly after processing and/or moving through the pressure chamber 200. In an exemplary embodiment of the heating chamber 300, a temperature is increased for sputtering on the substrate 10, and moisture remaining on the substrate 10 is removed.

The sputter tray 100 is transported to the sputtering chamber 400 directly after processing and/or moving through the heating chamber 300. In an exemplary embodiment of the sputtering chamber 400, a metal is deposited on the substrate 10. In the illustrated embodiment, the metal is deposited on both the sputter tray 100 and the substrate 10.

The sputter tray 100 is carried to the rotation chamber 500 directly after processing and/or moving through the sputtering chamber 400. In an exemplary embodiment of the rotation chamber 500, a direction of the sputter tray 100 is rotated (e.g., reversed) such that the sputter tray 100 is again moved to the sputtering chamber 400, as is indicated by the curved arrow adjacent to the rotation chamber 500 in FIG. 1. The first face and the second face of the substrate 10 and the sputter tray 100 may remain disposed facing the same direction after rotation within the rotation chamber 500. Alternatively, a facing direction of the first face and the second face of the substrate 10 and the sputter tray 100 may be reversed before passing in return sequence through the sputtering chamber 400, the heating chamber 300 and the pressure chamber 200.

Where the sputter tray 100 is initially moved to the pressure chamber 200 in a right direction of FIG. 1 indicated by the right-pointing arrow during a first pass of the sputter tray 100 through the sputtering process, the sputter tray is initially moved to the sputtering chamber 400 in a left direction of FIG. 1 indicated by the left-pointing arrow during a second (reverse) pass of the sputter tray 100 through the sputtering process. The sputter tray 100 is transferred and processed sequentially through the heating chamber 300 and the pressure chamber 200, directly after processing and/or moving through the sputtering chamber 400 in the second (reverse) pass.

In an exemplary embodiment, during the second pass of the sputter tray 100, the pressure is increased to atmospheric pressure in the pressure chamber 200, from the vacuum state, and the sputter tray 100 is output from the pressure chamber 200 as a last station of the second pass and of an entire of the sputtering process illustrated in FIG. 1.

In an exemplary embodiment, partitions (not shown) may be disposed in the pressure chamber 200, the heating chamber 300, and/or the sputtering chamber 400, but not the rotation chamber 500. The partitions are disposed such that the pressure chamber 200, the heating chamber 300, and the sputtering chamber 400 are not influenced by a previous process when the sputter tray 100 is transported through each of the pressure chamber 200, the heating chamber 300, and the sputtering chamber 400, respectively, and transported to an external (e.g., outside) of all the processing chambers after the sputter tray 100 is outputted from the sputtering process after the second pass.

Figure 2:
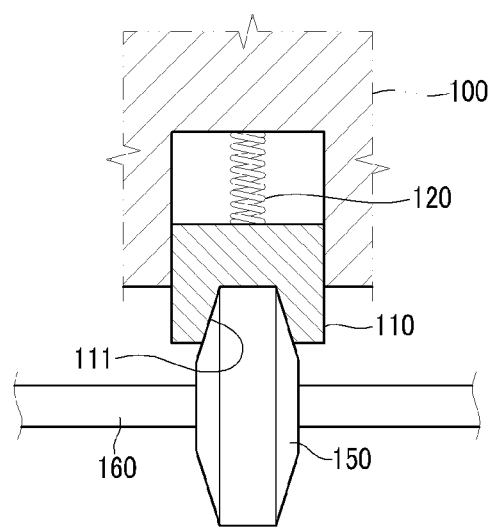
FIG. 2 is a cross-sectional view of an exemplary embodiment a sputter tray moving system, according to the sputtering process shown in FIG. 1.

FIG. 2 is a cross-sectional view of an exemplary embodiment of a sputter tray moving system, according to the sputtering process shown in FIG. 1.

As shown in FIG. 2, the guide 110 is disposed under the lower edge of the sputter tray 100. A lowermost edge of the guide 110 is protruded further than the lower edge of the sputter tray 100. Referring to FIG. 2, a portion of the guide 110 between the lowermost edge to the uppermost edge overlaps a portion of a side edge of the sputter tray 110.

The guide 110 attached to the sputter tray 100, is engaged with the pulley 150. When the pulley 150 is rotated by the motor 170, the guide 110 and the attached sputter tray 100 are thereby moved in a rotation direction of the pulley 150.

A buffer member 120 is disposed between the sputter tray 100 and the guide 110, such that vertical reaction (e.g., displacement towards and away from the driving shaft 160) of the sputter tray 100 during processing is maximally transmitted to the pulley 150, to thereby maximize the friction force between the sputter tray 100 and the pulley 150. Also, the buffer member 120 reduces impact and vibration applied to the sputter tray 100 when the sputter tray 100 is moved through the pressure chamber 200, the heating chamber 300, the sputtering chamber 400, and the rotation chamber 500 during the sputtering process. In the illustrated embodiment, the buffer member 120 includes a spring.

In the illustrated embodiment of FIG. 2, a first portion of the guide 110 and an entire of the buffer member 120 is disposed at an inner area of the sputter tray 100, while a remaining portion of the guide 110 extends to an outside of the sputter tray 100 and is visible from an outside of the sputter tray 100. The buffer member 120 is disposed between an upper surface of the first portion of the guide 110 and an inner surface of the sputter tray 100 which is substantially parallel with the upper surface of the first portion of the guide 110. When the sputter tray 100 moves in a downward vertical direction, the buffer member 120 is deformed (e.g., compressed) to absorb the displacement of the downward motion. Conversely, when the sputter tray 100 moves in an upward vertical direction, the buffer member 120 is deformed (e.g., extends or stretches) to absorb the displacement of the upward motion.

The sputter tray 100 is translatable in the downward vertical and upward vertical directions relative to the guide 110. In an exemplary embodiment, the first portion of the guide 110 disposed at the inner area of the sputter tray 100 is slidably disposed relative to inner sidewalls at the inner area of the sputter tray 100, when the buffer member 120 is compressed or extended by a force applied by the sputter tray 100 or by the movement system including the pulley 150 and the driving shaft 160, during movement of the sputter tray 100 through the sputtering process.

A groove 111 is disposed in the guide 110, and at a portion of the guide 110 which is engaged with the pulley 150. The groove 111 of the guide 110 and the pulley 150 directly contact each other, such that rotation of the pulley 150 effects a movement of the sputter tray 100 attached to the guide 110. The groove 111 is extended from the lowermost surface of the guide 110, to an inner area of the guide 110.

In the illustrated embodiment, outer surfaces of the pulley 150 have a substantial wedge shape, such as when viewed in a cross-section along the rotation direction shown in FIG. 2. A distal end of the wedge shape is disposed at an inner area of the guide 110 when the pulley 150 is engaged with the groove 111 of the guide 110. Inner surfaces of both of opposing sides of the groove 111 with respect to the pulley 150 are tapered, such that the pulley 150 may be substantially centrally aligned in the groove 111 when the pulley 150 and the groove 111 are engaged with each other. When the pulley 150 and the groove 111 are engaged with each other, the lowermost surface of the guide 110 is disposed spaced apart from the driving shaft 160. A lowermost surface of the sputter tray 100 is also spaced away from the driving shaft 160 and the pulley 150.

When the guide 110 attached to the sputter tray 100 is engaged with the pulley 150, the sputter tray 100 is moved such that the slip phenomenon in the movement direction of the sputter tray 100 is reduced upon start and stop of movement of the sputter tray 100. Advantageously, an increase in the moving speed of the sputter tray 100 in the movement direction through the sputtering process can be achieved, and as a result, the productivity is improved.

Also, the buffer member 120 reduces the (vertical) impact when the sputter tray 100 is moved through the sputtering process, thereby reducing or effectively preventing the vibration of the substrate 10. Advantageously, dropping of the particles of the sputtering material of the sputter tray 100 onto the substrate 10 due to the impact of the sputter tray 100 and the vibration of the substrate 10 may be reduced or effectively prevented.

Figure 3:
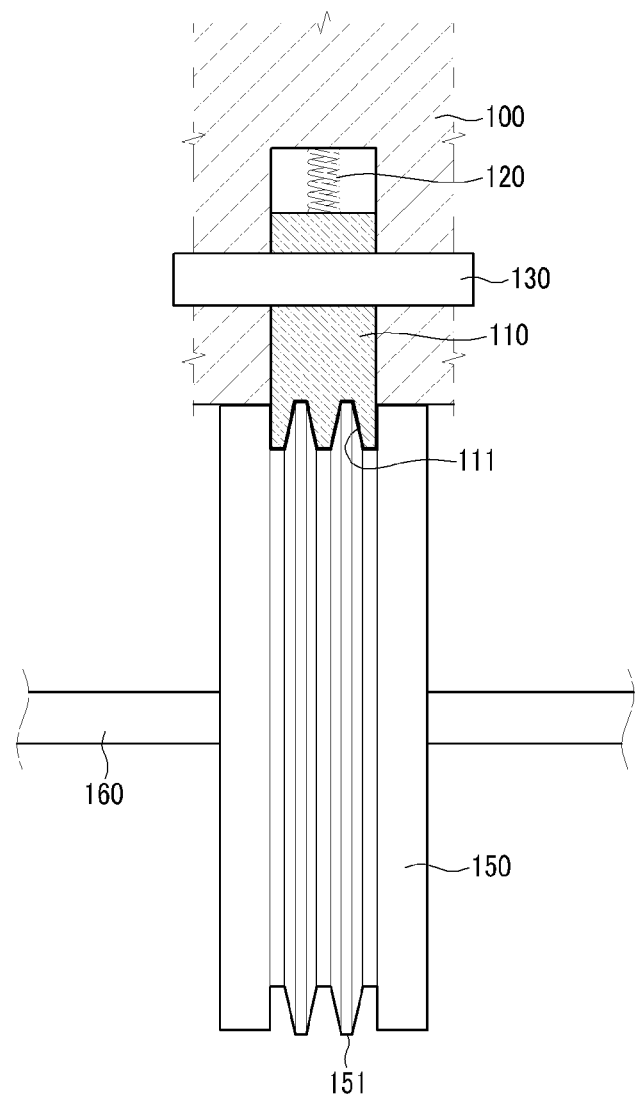
FIG. 3 is a cross-sectional view of another exemplary embodiment of a sputter tray moving system according to the sputtering process shown in FIG. 1.

FIG. 3 is a cross-sectional view of another exemplary embodiment of a sputter tray moving system according to the sputtering process shown in FIG. 1.

As shown in FIG. 3, a guide 110 is disposed under the lower edge of sputter tray 100, and a buffer member 120 including a spring is disposed between the sputter tray 100 and the guide 110, such that the vertical reaction (e.g., force) of the sputter tray 100 is maximally transmitted to the pulley 150, thereby maximizing the friction force between the sputter tray 100 and the pulley 150. Also, the buffer member 120 reduces the impact and the vibration applied to the sputter tray 100 when the sputter tray 100 is moved. When the sputter tray 100 moves in a downward vertical direction, the buffer member 120 is compressed to absorb the displacement of the downward motion, and the compressive force of the buffer member 120 is translated to the guide 110 which is pushed against the pulley 150, thereby applying the vertical reaction of the sputter tray 100 to the pulley 150 through the guide 110.

Referring to FIG. 3, the guide 110 may be fixed to the sputter tray 100 solely by a fixing member 130. A portion of the guide 110 may be disposed between the fixing member 130 and a side edge of the sputter tray 100. The fixing member 130 may be a band-like element disposed around and contacting side edges, the first face and/or the second face of the sputter tray 100, such that the fixing member 130 maintains the guide 110 in contact with the sputter tray 100. A lowermost edge of the guide 110 is protruded further than a lowermost edge of the sputter tray 100. A portion of the guide 110 between the lowermost edge of the guide 110 and the uppermost edge overlaps a portion of the side edge of the sputter tray 100.

In the illustrated embodiment of FIG. 3, a first portion of the guide 110 and an entire of the buffer member 120 is disposed at an inner area of the sputter tray 100, while a remaining portion of the guide 110 extends to an outside of the sputter tray 100 and is visible from an outside of the sputter tray 100. The buffer member 120 is disposed between an upper surface of the first portion of the guide 110 and an inner surface of the sputter tray 100 which is substantially parallel with the upper surface of the first portion of the guide 110. When the sputter tray 100 moves in a downward vertical direction, the buffer member 120 is compressed to absorb the displacement of the downward motion. Conversely, when the sputter tray 100 moves in an upward vertical direction, the buffer member 120 extends to absorb the displacement of the upward motion.

The sputter tray 100 is translatable in the downward vertical and upward vertical directions relative to the guide 110 and the fixing member 130. In an exemplary embodiment, the first portion of the guide 110 disposed at the inner area of the sputter tray 100 is slidably disposed relative to inner sidewalls at the inner area of the sputter tray 100, when the buffer member 120 is compressed or extended by a force applied by the sputter tray 100 or by the movement system including the pulley 150 and the driving shaft 160, during movement of the sputter tray 100 through the sputtering process.

A plurality of a groove 111 is disposed in a portion of the guide 110 where the pulley 150 is engaged with the guide 110. In the illustrated embodiment, two grooves 111 are disposed recessed inward from the lowermost edge of the guide 110.

A plurality of a protrusion 151 is disposed according to the circumference of the pulley 150, in a portion of the pulley 150 which is engaged with the grooves 111 of the guide 110. Distal ends of the protrusions 151 are disposed at an inner area of the guide 110 when the protrusions 151 are engaged with the grooves 111 of the guide 110. The protrusions 151 are defined by recesses extending inward from the outer circumference of the pulley 150, and the protrusions 151 and the recesses alternate with each other in the longitudinal direction of the driving shaft 160. In alternative embodiments, there may be more than two protrusions 151 and/or grooves 111.

When the protrusion 151 of the pulley 150, and the grooves 111 of the guide 110 are respectively engaged and contacting each other, a lowermost surface of the guide 110 may contact the outer circumference of the pulley 150, as illustrated in FIG. 3. A portion of the lowermost surface of the guide 110 overlaps an entire of the thickness of the pulley 150 in the longitudinal direction of the driving shaft 160.

The grooves of the guide 110 and the protrusions 151 of the pulley 150 are engaged with each other, such that the sputter tray 100 is moved when the pulley 150 is rotated. A cross section of the protrusions 151 of the pulley 150 taken in the rotation direction have a substantially wedge shape as illustrated in FIG. 3. Inner surfaces of both of opposing sides of the grooves 111 with respect to the protrusion 151, are tapered such that the protrusions 151 of the pulley 150 are aligned substantially at the center of the grooves 111 when aligning and engaging the pulley 150 to the grooves 111.

When the grooves 111 of the guide 110 attached to the sputter tray 100 are engaged with the protrusions 151 of the pulley 150, the sputter tray 100 is moved such that the slip phenomenon in the movement direction of the sputter tray 100 is reduced upon the start and stop of movement of the sputter tray 100. Advantageously, an increase in the moving speed of the sputter tray 100 in the movement direction through the sputtering process can be achieved, and as a result, the productivity is improved.

Also, the buffer member 120 reduces the vertical impact when the sputter tray 100 is moved through the sputtering process, thereby reducing or effectively preventing the vibration of the substrate 10. Advantageously, dropping of the particles of the sputtering material of the sputter tray 100 onto the substrate 10 due to the impact of the sputter tray 100 and the vibration of the substrate 10 may be reduced or effectively prevented. When the sputter tray 100 moves in a downward vertical direction, the buffer member 120 is compressed to absorb the displacement of the downward motion, and the compressive force of the buffer member 120 is translated to the guide 110 which is pushed against an outer circumference of the pulley 150, thereby applying the vertical reaction of the sputter tray 100 to the pulley 150 through the guide 110.

While this invention has been described in connection with what is presently considered to be exemplary embodiments, it is to be understood that the invention is not limited to the illustrated embodiments, but, on the contrary, is intended to cover various modifications and equivalent arrangements included within the spirit and scope of the appended claims.

What is claimed is:
1. A sputter tray moving system comprising:
a sputter tray;
a guide disposed at an inside of the sputter tray, and including a groove which protrudes from a lowermost edge of the guide to an inside of the guide;
a pulley engaged with the groove of the guide; and
a buffer member disposed between the sputter tray and the guide,
wherein
the sputter tray is moved when the pulley engaged with the groove of the guide is rotated in a rotation direction, inner walls of the sputter tray are slidably disposed with respect to outer walls of the guide, such that the inner walls of the sputter tray are moveable toward and away from the pulley, and the groove of the guide is longitudinally extended in the rotation direction.

2. The sputter tray moving system of claim 1, wherein outer surfaces of the pulley directly contact inner surfaces of the groove of the guide.

3. The sputter tray moving system of claim 2, wherein inner surfaces of opposing sides of the groove of the guide, with respect to the pulley, are tapered in a cross-sectional view along the rotation direction.

4. The sputter tray moving system of claim 3, wherein the pulley has a wedge shape in a cross-sectional view of the pulley in the rotation direction.

5. The sputter tray moving system of claim 4, further comprising a motor driving the pulley.

6. The sputter tray moving system of claim 5, wherein the pulley and the motor are connected to each other through a driving shaft.

7. The sputter tray moving system of claim 1, further comprising a fixing member fixing the guide to the sputter tray.

8. The sputter tray moving system of claim 7, wherein the groove of the guide is provided as a plurality thereof.

9. The sputter tray moving system of claim 8, wherein the pulley includes a plurality of a protrusion.

10. The sputter tray moving system of claim 9, wherein the protrusions are disposed according to the circumference of the pulley, and are respectively engaged with the grooves of the guide.

11. The sputter tray moving system of claim 1, wherein an entire of the buffer member is at the inside of the sputter tray.

12. A sputter tray moving system comprising:

a sputter tray;

a roller rotatable in a first direction;

a guide disposed at an inside of the sputter tray, and including a groove which protrudes from a lowermost edge of the guide to an inside of the guide and longitudinally extends in the first direction; and a buffer member disposed between the sputter tray and the guide, wherein an outer surface of the roller is engaged with and contacts an inner surface of the groove of the guide, such that the sputter tray is moved in the first direction when the pulley is rotated in the first direction, and inner walls of the sputter tray are slidably disposed with respect to outer walls of the guide, such that the inner walls of the sputter tray are moveable toward and away from the roller.

13. The sputter tray moving system of claim 12, wherein the buffer member is deformable in a second direction substantially perpendicular to the first direction, when the sputter tray is moved in the first direction.

14. The sputter tray moving system of claim 13, wherein the guide further includes a plurality of the groove disposed substantially parallel with each other; and the roller includes a plurality of a protrusion each longitudinally extended in the first direction and disposed respectively contacting a groove of the guide.

* * * * *